(12) United States Patent
Rueda et al.

(10) Patent No.: US 11,616,134 B2
(45) Date of Patent: Mar. 28, 2023

(54) LDMOS TRANSISTOR WITH IMPLANT ALIGNMENT SPACERS

(71) Applicant: NXP USA, Inc., Austin, TX (US)

(72) Inventors: Hernan Rueda, Chandler, AZ (US); Rodney Arlan Barksdale, Buda, TX (US); Stephen C Chew, Dripping Springs, TX (US); Martin Garcia, Buda, TX (US); Wayne Geoffrey Risner, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/316,091

(22) Filed: May 10, 2021

(65) Prior Publication Data

US 2022/0359727 A1 Nov. 10, 2022

(51) Int. Cl.
*H01L 29/66* (2006.01)
*H01L 29/08* (2006.01)
*H01L 29/40* (2006.01)
*H01L 29/78* (2006.01)

(52) U.S. Cl.
CPC ...... *H01L 29/66689* (2013.01); *H01L 29/086* (2013.01); *H01L 29/0878* (2013.01); *H01L 29/401* (2013.01); *H01L 29/402* (2013.01); *H01L 29/6656* (2013.01); *H01L 29/66553* (2013.01); *H01L 29/7816* (2013.01)

(58) Field of Classification Search
CPC ............. H01L 29/66689; H01L 29/086; H01L 29/0878; H01L 29/401; H01L 29/402; H01L 29/66553; H01L 29/6656; H01L 29/7816; H01L 21/28052; H01L 21/28247; H01L 29/0847; H01L 29/4933; H01L 29/404; H01L 29/6653; H01L 29/7835; H01L 29/66659
See application file for complete search history.

(56) References Cited

U.S. PATENT DOCUMENTS

| | | | |
|---|---|---|---|
| 5,472,894 A | 12/1995 | Hsu et al. | |
| 5,547,885 A | 8/1996 | Ogoh | |
| 5,837,571 A | 11/1998 | Pathak | |
| 7,989,879 B2 | 8/2011 | Rijs et al. | |
| 2005/0017310 A1 | 1/2005 | Granneman et al. | |
| 2009/0108347 A1 | 4/2009 | Adkisson et al. | |
| 2010/0244106 A1 | 9/2010 | Parker et al. | |

(Continued)

OTHER PUBLICATIONS

Theeuwen et al., "LDMOS Technology for RF Power Amplifiers," IEEE Transactions on Microwave Theory and Techniques, vol. 60, No. 6, Jun. 2012, pp. 1755-1763; 9 pages.

*Primary Examiner* — Mohammed R Alam

(57) ABSTRACT

A method for manufacturing a Laterally Diffused Metal Oxide Semiconductor (LDMOS) transistor with implant alignment spacers includes etching a gate stack comprising a first nitride layer. The first nitride layer is on a silicon layer. The gate stack is separated from a substrate by a first oxide layer. The gate stack is oxidized to form a polysilicon layer from the silicon layer, and to form a second oxide layer on a sidewall of the polysilicon layer. A drain region of the LDMOS transistor is implanted with a first implant aligned to a first edge formed by the second oxide layer. A second nitride layer is formed conformingly covering the second oxide layer. A nitride etch-stop layer is formed conformingly covering the second nitride layer.

16 Claims, 11 Drawing Sheets

(56) References Cited

U.S. PATENT DOCUMENTS

| | | | |
|---|---|---|---|
| 2015/0236117 A1* | 8/2015 | Kapoor | H01L 21/266 438/289 |
| 2016/0181400 A1* | 6/2016 | Qian | H01L 29/0847 438/286 |

* cited by examiner

LDMOS TRANSISTOR WITH IMPLANT ALIGNMENT SPACERS

FIELD

This disclosure relates generally to semiconductor fabrication, and more specifically to a semiconductor manufacturing process for improving the performance of a Laterally Diffused Metal Oxide Semiconductor (LDMOS) transistor.

BACKGROUND

Gain and linearity of a power amplifier that includes an LDMOS transistor are affected by parasitic feedback capacitance between the gate terminal and the source or drain terminals of the LDMOS transistor. Feedback capacitance is created in part from the implanted regions of the source and drain being in close proximity to the gate. With smaller geometries, aligning the implanted regions with photolithography means does not offer sufficient precision to reliably control the feedback capacitance.

High input impedance further degrades the gain and linearity of the LDMOS transistor. Attempts to reduce the input capacitance by scaling gate area undesirably increases gate resistance. Reduction of gate resistance by increasing the gate metal thickness is hampered by photolithography and etch process issues due an increased aspect ratio of the gate stack and reflectivity issues caused by the reflectivity of the gate metal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for improvements in the gain and linearity of semiconductor devices through reduction of feedback capacitance and input impedance. Specifically, a plurality of conformal liners is formed over a gate stack, to controllably offset implants to engineer drain and source profiles. The liners further permit the formation of a thick, low resistance Cobalt Silicide (CoSi) gate electrode without compromising the drain and source implant regions, and further enabling gate stack etching with improved aspect ratio and focal depth.

Figure 1:
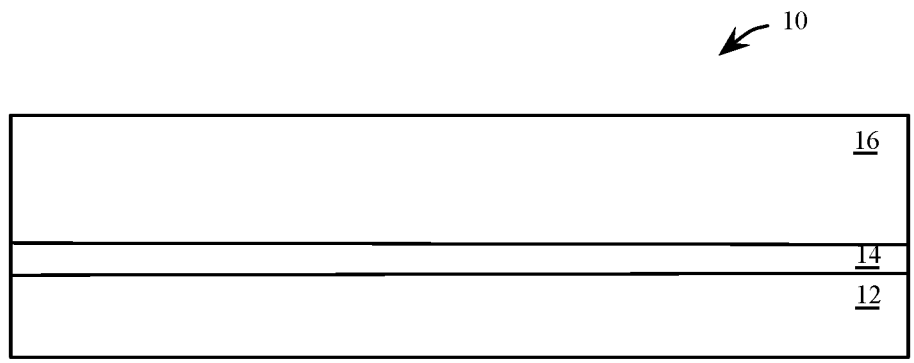
FIG. 1 is a cross-sectional view of a fabrication stage of an LDMOS transistor, in accordance with an example embodiment of the present disclosure.

FIG. 1 shows a cross-sectional view of an example embodiment 10 of a fabrication stage of a semiconductor device (e.g., a Laterally Diffused Metal Oxide Semiconductor (LDMOS) field effect transistor, or LDMOS transistor). A substrate 12 (e.g., a silicon substrate) is oxidized to form a first oxide layer 14. An amorphous silicon layer 16 is deposited on the first oxide layer 14. In another embodiment, layer 16 may be deposited as polysilicon, and references to amorphous silicon layer 16 are substituted with polysilicon, wherein a subsequent oxidization is not required to convert the amorphous silicon to polysilicon. In one example embodiment, a thickness of the first oxide layer 14 is chosen based on a desired transconductance, input capacitance and/or threshold voltage of an LDMOS transistor. In one example embodiment, a thickness of the amorphous silicon layer 16 is chosen to provide sufficient residual polysilicon after the amorphous silicon layer 16 is oxidized and reacted with Cobalt to form an overlaying CoSi electrode.

Figure 2:
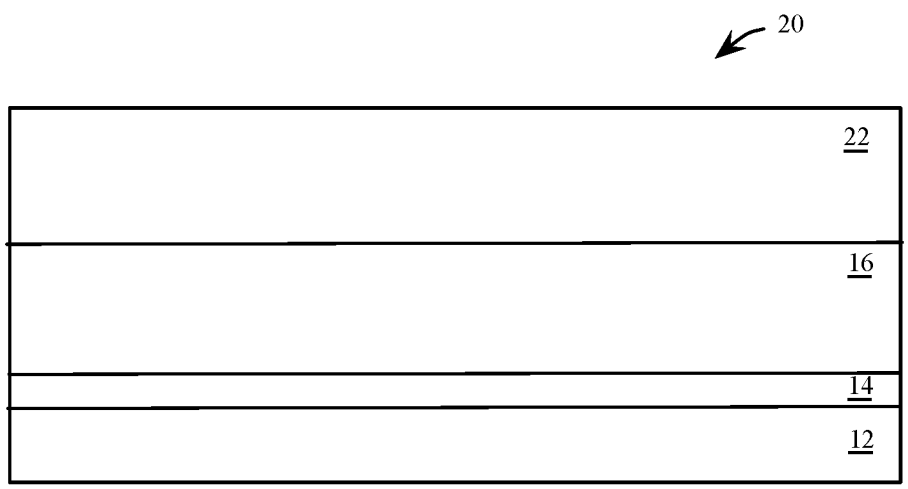
FIG. 2 is a cross-sectional view of a fabrication stage of the embodiment of FIG. 1 after depositing a nitride layer, in accordance with an example embodiment of the present disclosure.

FIG. 2 shows a cross-sectional view of an example embodiment 20 of a fabrication stage subsequent to FIG. 1, wherein a first nitride layer 22 is formed over the amorphous silicon layer 16.

Figure 3:
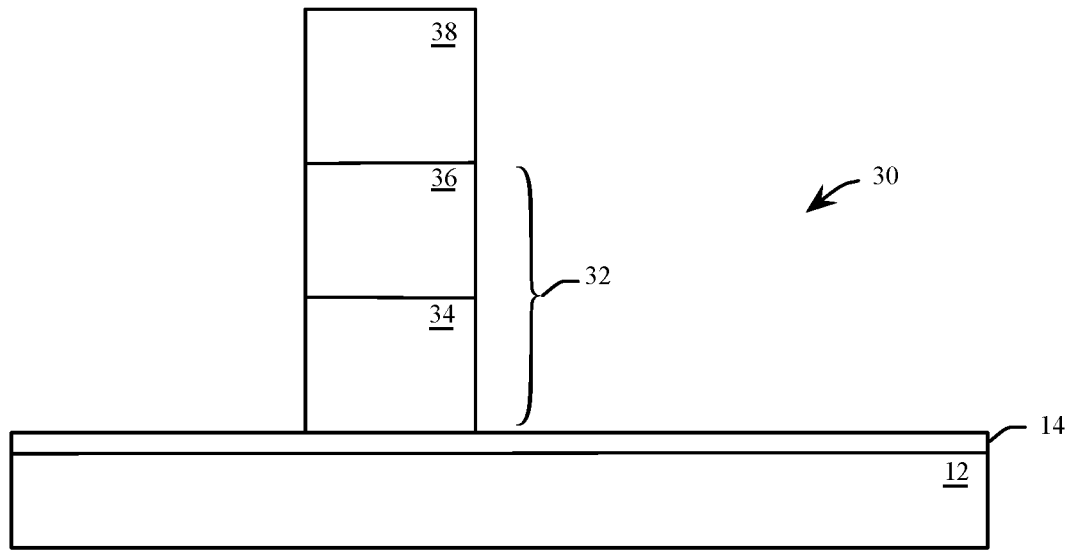
FIG. 3 is a cross-sectional view of a fabrication stage of the embodiment of FIG. 2 after etching a gate stack, in accordance with an example embodiment of the present disclosure.

FIG. 3 shows a cross-sectional view of an example embodiment 30 of a fabrication stage subsequent to FIG. 2. In the example embodiment 30, a gate stack 32 is formed by depositing a photoresist layer 38 over the nitride layer 36, and patterning the photoresist layer 38 to leave photoresist material over the area where the gate stack 32 is to be formed. An etching process is then performed, which results in an etched amorphous silicon layer 34, and an etched first nitride layer 36. The etched first nitride layer 36 and the etched amorphous silicon layer 34 are formed by etching the first nitride layer 22 and the amorphous silicon layer 16 of FIG. 2. The etchant process stops at oxide layer 14. The gate stack 32 of FIG. 3 provides a more controllable etch using conventional photolithography while enabling a higher aspect ratio (e.g., the height of the amorphous silicon 34 and first nitride layer 36 divided by a width of any of the layers). Specifically, the first nitride layer 36 has a reduced reflectivity, (compared to metal gates), which improves focal depth and sharpness, such that the focus of the photolithography has less deviation between the top of the gate stack 32 to the bottom of the gate stack 32. This enables a higher aspect ratio of the gate stack 32, which further enables a narrower gate length and/or thicker metal gate (subsequently formed with the amorphous silicon layer 34). After the etching process the remaining photoresist 38 is removed.

Figure 4:
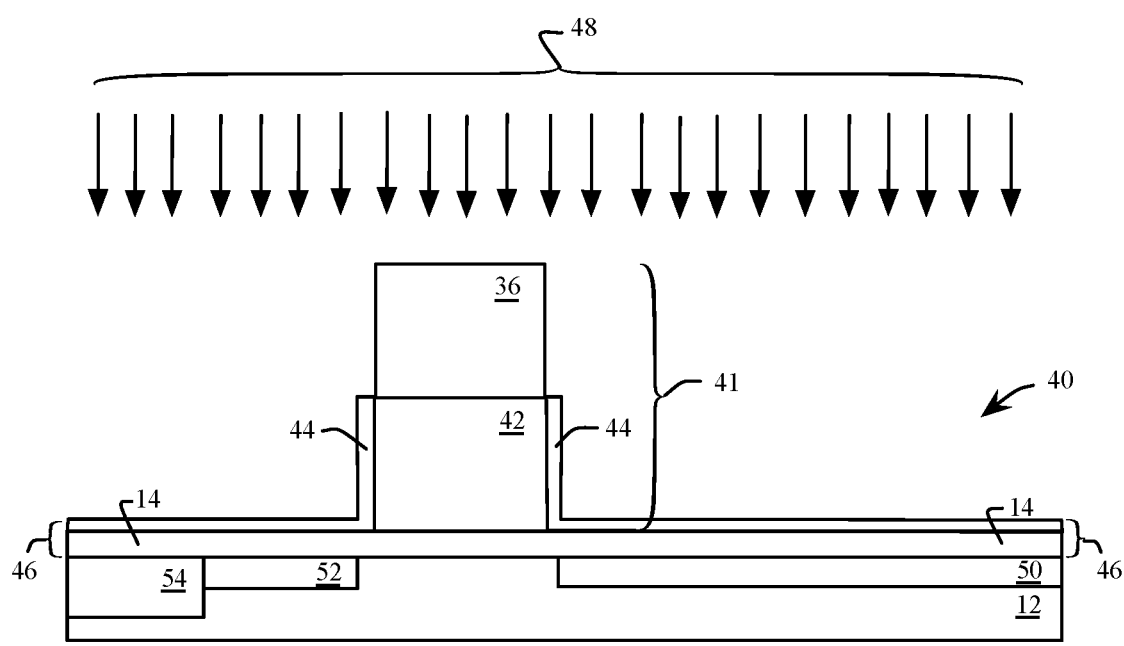
FIG. 4 is a cross-sectional view of a fabrication stage of the embodiment of FIG. 3 after an oxidation and a spacer aligned implantation step, in accordance with an example embodiment of the present disclosure.

FIG. 4 shows a cross-sectional view of an example embodiment 40 of a fabrication stage subsequent to FIG. 3. In the example embodiment 40, an oxidizing step is performed using a high temperature furnace anneal in an oxygen ambient. Accordingly, the amorphous silicon layer 34 of FIG. 3 is converted to a polysilicon layer 42, as shown in the gate stack 41. In another embodiment, the amorphous silicon layer 34 is originally formed as a polysilicon layer with little or no further crystallization occurring at this step. The oxidizing step also forms a second oxide layer 44 on sidewalls of the polysilicon layer 42. The second oxide layer 44 is designed to have a thickness, when combined with the first oxide layer 14 for a combined oxide layer 46, is sufficient to prevent the formation of CoSi (in a subsequent step) over the sidewalls of the polysilicon layer 42 and over the later-implanted substrate regions. A self-aligned implant 48 is then performed to form an N− implant region 50 and an N− implant region 52, each self-aligned to a horizontal edge (or horizontal exterior surface) of the second polysilicon layer 44. In one example embodiment, the region 50 is a drift region of an LDMOS transistor. The N− implant region 50 establishes a lateral junction position and maximum depletion width of the drift region adjacent to the gate stack 41. In one embodiment, the region 52 is subsequently counter-doped with a subsequent source and P− type well dopant. In another embodiment, P type doping in the region 52 is prevented by masking the implant over the region 52 (e.g., protecting region 52 with a patterned mask). In one embodiment of an LDMOS transistor, a non-self-aligned P+ region 54 is formed as a body contact of the LDMOS transistor.

Figure 5:
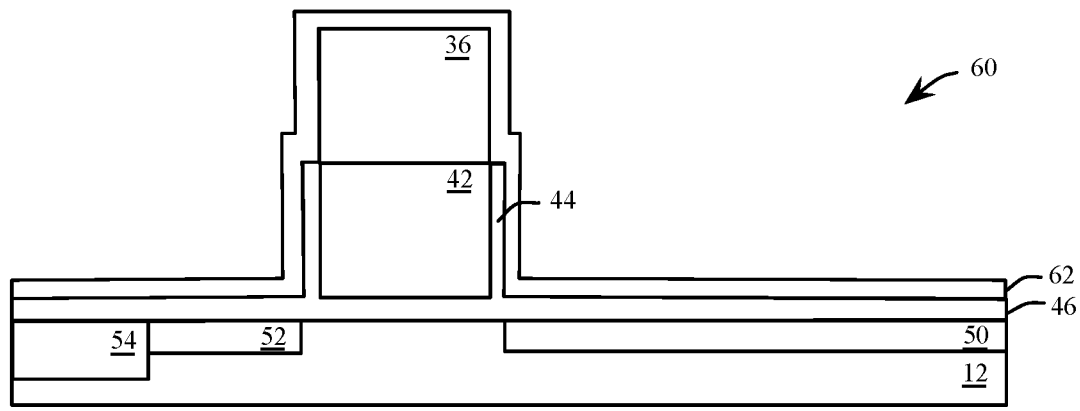
FIG. 5 is a cross-sectional view of a fabrication stage of the embodiment of FIG. 4 after depositing a nitride liner, in accordance with an example embodiment of the present disclosure.
Figure 6:
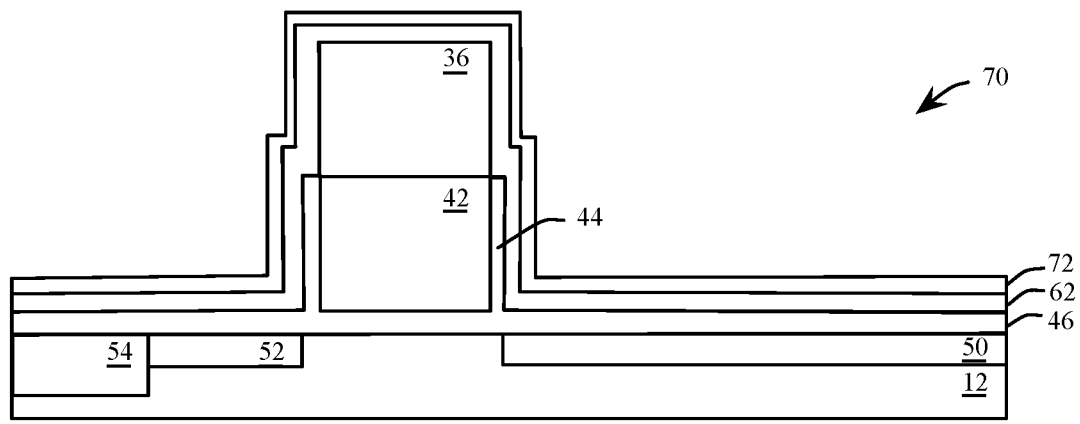
FIG. 6 is a cross-sectional view of a fabrication stage of the embodiment of FIG. 5 after depositing a Tetraethyl Orthosilicate (TEOS) etch stop layer, in accordance with an example embodiment of the present disclosure.

FIG. 5 shows a cross-sectional view of an example embodiment 60 of a fabrication stage subsequent to FIG. 4. In the example embodiment 60, a nitride liner 62 is deposited over the second oxide layer 44, as well as the nitride layer 36. The nitride layer 62 protects the second oxide layer 44 and combined oxide layer 46 from being reduced or removed from subsequent processing steps, and also provides for a self-aligned edge for subsequent implants. FIG. 6 shows a cross-sectional view of an example embodiment 70 of a fabrication stage subsequent to FIG. 5. In the example embodiment 70, a Tetraethyl Orthosilicate (TEOS) liner 72 is deposited over the nitride liner 62. The TEOS liner 72 provides an etch stop for a subsequent nitride spacer, as well as a self-aligned edge for subsequent implants.

Figure 7:
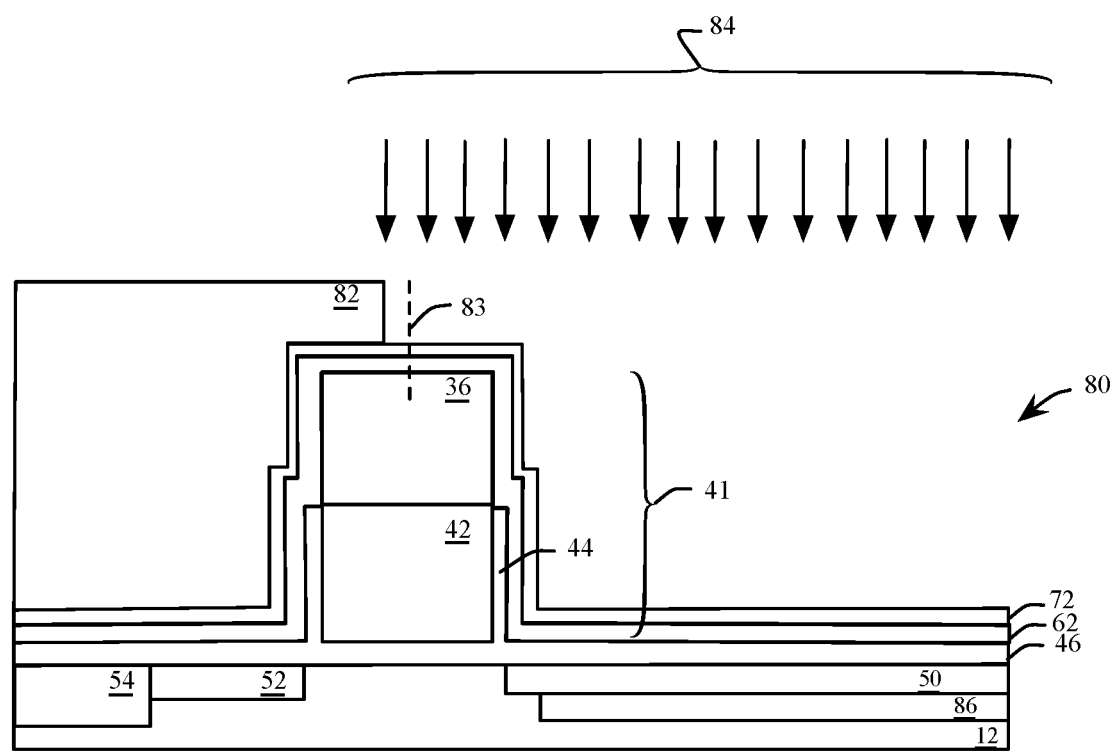
FIG. 7 is a cross-sectional view of a fabrication stage of the embodiment of FIG. 6 after a spacer aligned implantation step, in accordance with an example embodiment of the present disclosure.

FIG. 7 shows a cross-sectional view of an example embodiment 80 of a fabrication stage subsequent to FIG. 6. In the example embodiment 80, a photoresist layer 82 is deposited and patterned to have an edge that is aligned substantially to the center 83 of the gate stack 41. The alignment tolerance of the photoresist layer 82 to the center 83 is greatly improved by the addition of the nitride liner 62 and TEOS liner 72, by effectively widening the gate stack 41. A self-aligned implant 84 is performed to form an N− implant region 86, self-aligned to an edge of the TEOS liner 72 (e.g., the left edge of the N− implant region 86 is aligned to the right edge of the TEOS liner 72). In one example embodiment, the region 86 is combined with the region 50 to provide a graded drift region of an LDMOS transistor. After the implant process the remaining photoresist layer 82 is removed.

Figure 8:
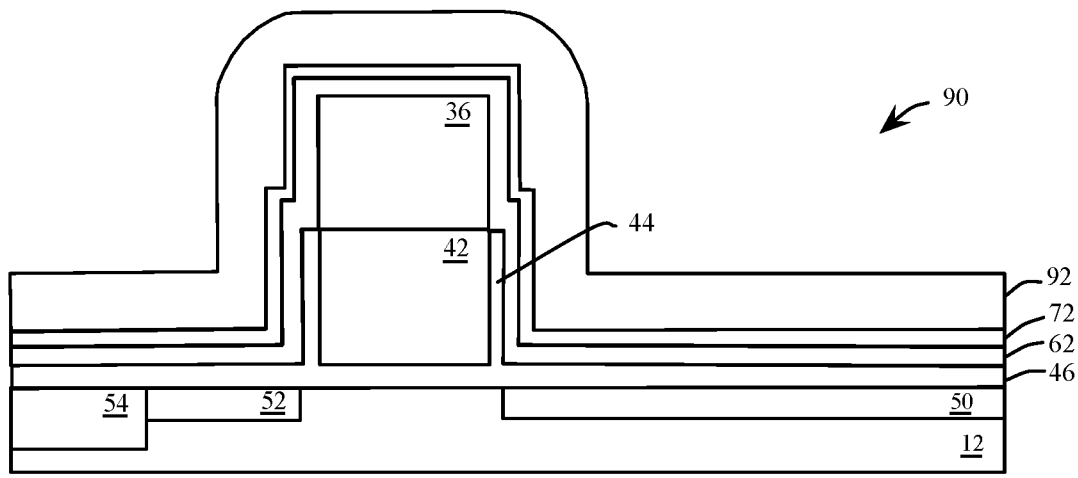
FIG. 8 is a cross-sectional view of a fabrication stage of the embodiment of FIG. 7 after deposition of a nitride spacer, in accordance with an example embodiment of the present disclosure.
Figure 9:
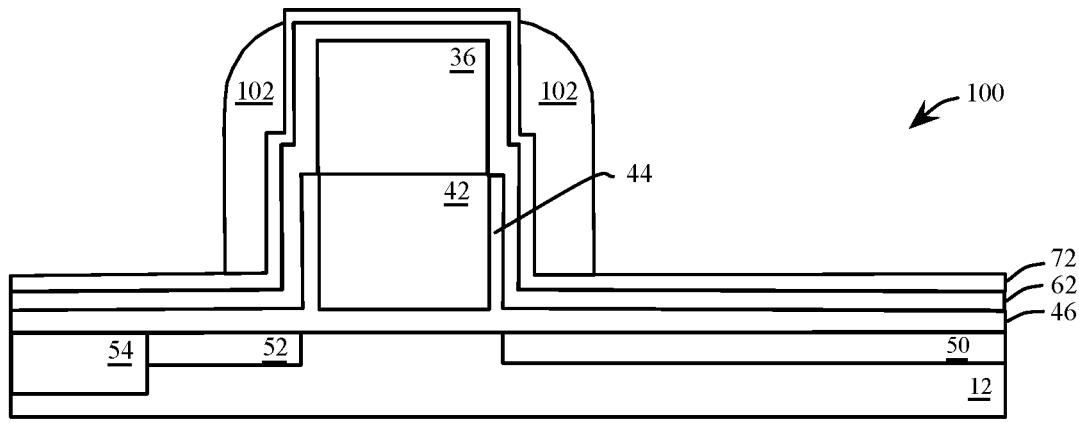
FIG. 9 is a cross-sectional view of a fabrication stage of the embodiment of FIG. 8 after etching the nitride spacer, in accordance with an example embodiment of the present disclosure.

FIG. 8 shows a cross-sectional view of an example embodiment 90 of a fabrication stage subsequent to FIG. 6. In the example embodiment 90, a nitride spacer 92 is deposited over the TEOS liner 72. The presence and thickness of the nitride spacer 92 is chosen to optimize subsequent processing parameters including implant dose, implant energy, furnace drive temperatures and time, and Rapid Thermal Annealing (RTA) temperature and time, required to complete construction of an LDMOS transistor. FIG. 9 shows a cross-sectional view of an example embodiment 100 of a fabrication stage subsequent to FIG. 8. In the example embodiment 100, an anisotropic etch of the nitride spacer 92 of FIG. 8 is performed to form a pair of nitride spacers 102. The TEOS liner 72 is used as an etch-stop when etching the nitride spacer 92.

Figure 10:
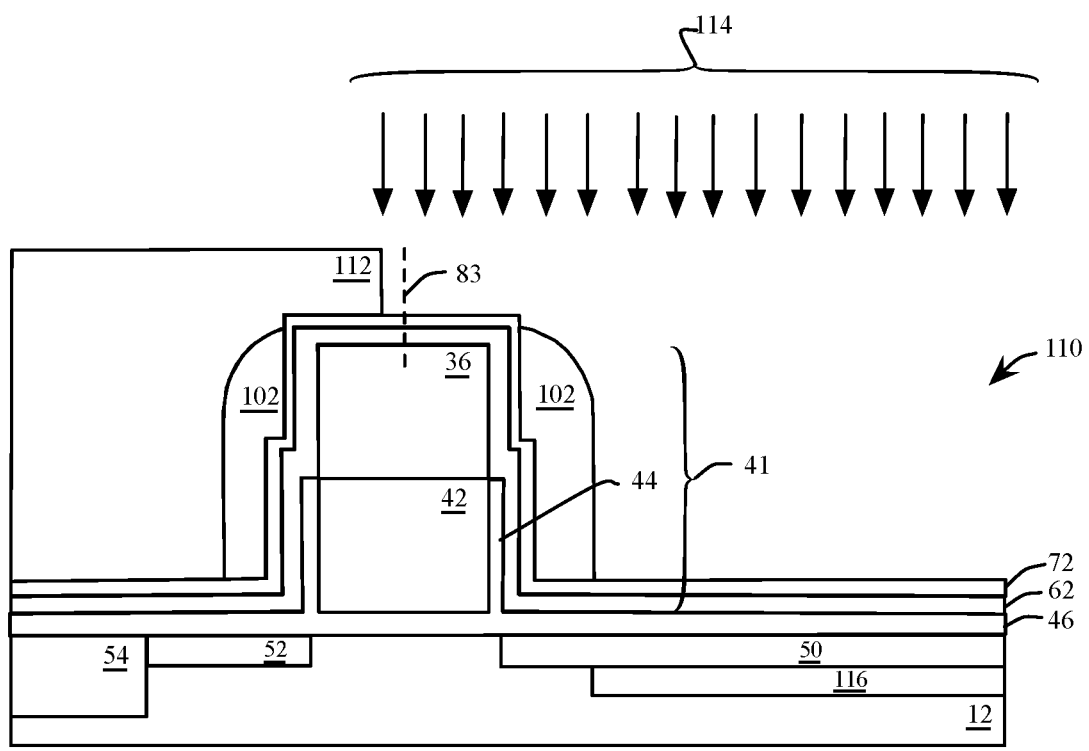
FIG. 10 is a cross-sectional view of a fabrication stage of the embodiment of FIG. 9 after a spacer aligned implantation step, in accordance with an example embodiment of the present disclosure.

FIG. 10 shows a cross-sectional view of an example embodiment 110 of a fabrication stage subsequent to FIG. 9. In the example embodiment 110, an edge of a patterned photoresist layer 112 is aligned substantially to the center 83 of the gate stack 41. A self-aligned implant 114 is performed to form an N− implant region 116, self-aligned to an edge of the nitride spacer 102 (e.g., the left edge of the N− implant region 116 is aligned to the right edge of the nitride spacer 102). In one example embodiment, the region 116 is combined with the region 50 to provide a graded drift region of an LDMOS transistor. In contrast to FIG. 7, where the implant region 86 is aligned to the edge of the TEOS liner 72, the implant region 116 of FIG. 10 is aligned to the edge of the nitride spacer 102. In another example embodiment an N-implant forming part of the drift region of the LDMOS transistor, is aligned to an edge of either the second oxide layer 44, the nitride liner (or layer) 62, the TEOS liner (or equivalent nitride etch-stop layer) 72 or the nitride spacer 102. After the implant process, the remaining photoresist layer 112 is removed.

Figure 11:
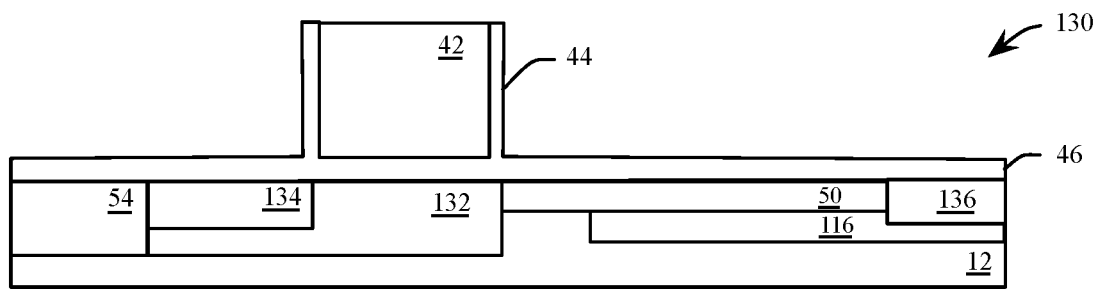
FIG. 11 is a cross-sectional view of a fabrication stage of the embodiment of FIG. 10 after removing the nitride spacer, TEOS etch stop layer, nitride liner and nitride layer, in accordance with an example embodiment of the present disclosure.

FIG. 11 shows a cross-sectional view of an example embodiment 130 of a fabrication stage subsequent to FIG. 10. In the example embodiment 130, a P-Well 132, an N+ source 134 and an N+ drain 136 are formed. In another embodiment, the formation of the P-Well, N+ source 134 and N+ drain 136 are formed prior to the self-aligned implant 114 of FIG. 10. The example embodiment 130 further shows the removal the nitride spacer 102, TEOS liner 72 and nitride liner 62 and nitride layer 36. In an example embodiment where the nitride spacer 102 is not formed, only the TEOS liner 72 and nitride liner 62 and nitride layer 36 (from the gate stack) are removed.

In one example embodiment, the P-Well 132 is formed by patterning a photoresist layer substantially aligned to the center 83 and covering the N-implants 50 and 116. The P-Well 132 is then implanted into the substrate 12, where an edge of the P-well 132 is aligned to an edge of the nitride spacer 102. The photoresist layer covering the N-implants 50 and 116 is then removed. A furnace anneal or Rapid Thermal Anneal (RTA) is performed to anneal implant damage and to drive the P-Well 132 laterally under polysilicon 42. The specific parameters for annealing are chosen based on the required positioning of the P-Well 132 and depths of the N-implants 50 and 116.

In one example embodiment, the N+ source 134 and N+ drain 136 are formed by adding a photoresist layer over the P+ region 54, and over the N-implants 50 and 116 (aligned with the center 83) and exposing the region where the N+ source 134 and N+ drain 136 will be implanted. The N+ source 134 is implanted, aligned to an edge of the nitride spacer 102. The N+ drain 136 is concurrently implanted. The photoresist layer is then removed. An RTA step is then performed to anneal N+ implant damage and to drive the N+ source 134 to the edge of the polysilicon 42.

In one embodiment, the nitride spacer 102 is removed by stripping with hot phosphoric acid. The TEOS liner 72 (or similar nitride spacer etch stop) is then stripped by a Hydrofluoric acid bath. The nitride liner 62 and the sacrificial gate nitride 36 are then removed by etching with a hot phosphoric acid.

As discussed with regards to FIG. 10 in comparison to FIG. 7, in other embodiments the N– implant 116 is replaced with an N– implant aligned to one of the second oxide layer 44, the nitride liner (or layer) 62 or the TEOS liner (or equivalent nitride etch-stop layer) 72.

Figure 12:
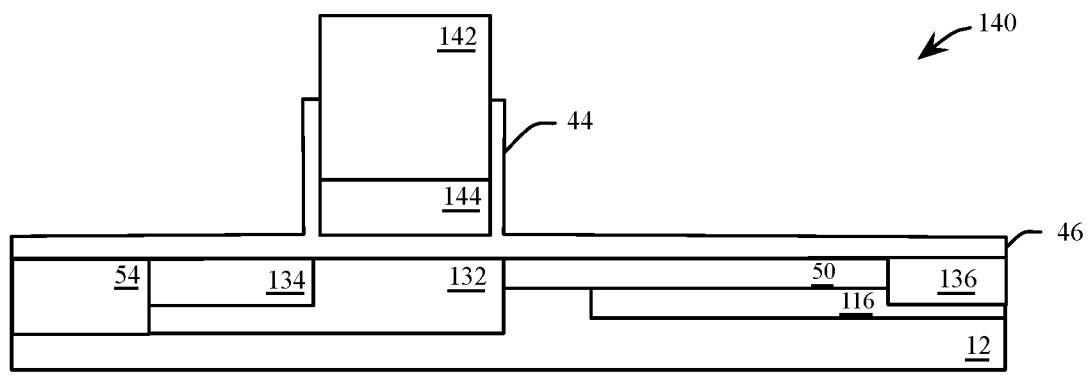
FIG. 12 is a cross-sectional view of a fabrication stage of the embodiment of FIG. 11 after formation of a first CoSi layer, in accordance with an example embodiment of the present disclosure.
Figure 13:
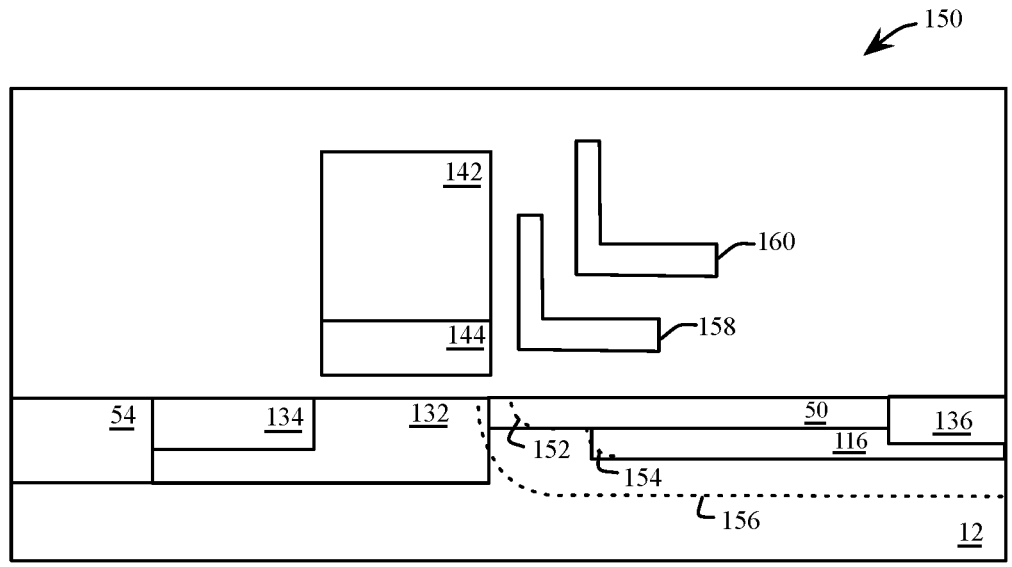
FIG. 13 is a cross-sectional view of a fabrication stage of the embodiment of FIG. 12 after forming field plates, in accordance with an example embodiment of the present disclosure.

FIG. 12 shows a cross-sectional view of an example embodiment 140 of a fabrication stage subsequent to FIG. 11. In the example embodiment 140, a cobalt deposition is performed on the top surface of the poly silicon layer 142, and then an annealing process is performed to form a CoSi layer 142. A residual polysilicon layer 144 remains after reacting with the cobalt to form the CoSi layer 142, and the oxide layer 44 extends at least partially up the sidewalls of the CoSi layer 142 within the gate stack. FIG. 13 shows a cross-sectional view of an example embodiment 150 of a fabrication stage subsequent to FIG. 12. In the example embodiment 150, the N– implant 50 and the N– implant 116 combine to form a graded drift region, shown symbolically by doping gradients 152 and 154 respectively combined into a total gradient 156. In one embodiment, the doping concentration of the N– implant 50 is less than a doping concentration of N– implant 116, thereby increasing a depletion width of the drift region (formed by implants 50 and 116) proximal to the gate formed by the residual polysilicon 144 and CoSi 142. Increasing the depletion width of the drift region near the gate advantageously reduces a feedback capacitance between the gate and the drain region 118. In another embodiment, further grading of the dopant in the drift region formed by N– implant 50 and N– implant 116 is achieved by additional implants respectively aligned to one of the second oxide layer 44, the nitride liner (or layer) 62, the TEOS liner (or equivalent nitride etch-stop layer) 72, or the nitride spacer 102 previously formed. In the embodiment 150, metal field plates 158 and 160 are formed to shield the gate from high potentials of the drain region 118. In one embodiment, the field plates 158 and 160 are grounded or connected to a fixed potential.

In one embodiment, the formation of the field plates 158 and 160 are formed by the following steps. A first Interlevel Dielectric (ILD), (for example SiO2), is conformally deposited over the combined oxide layer 46. A first conformal field plate metal layer (e.g., tungsten silicide) is formed over the first ILD. A photoresist is patterned laterally over the region defined by the field plate 158 of FIG. 13, the field plate 158 is formed by etching the remaining first field plate metal layer, and then the photoresist is removed. A second ILD is conformally deposited over the field plate 158, the field plate 160 is etched with a photoresist layer, and then the photoresist layer is removed, similar to the process used to form the field plate 158. Lastly, a thicker ILD is deposited over both field plates 158 and 160.

Figure 14:
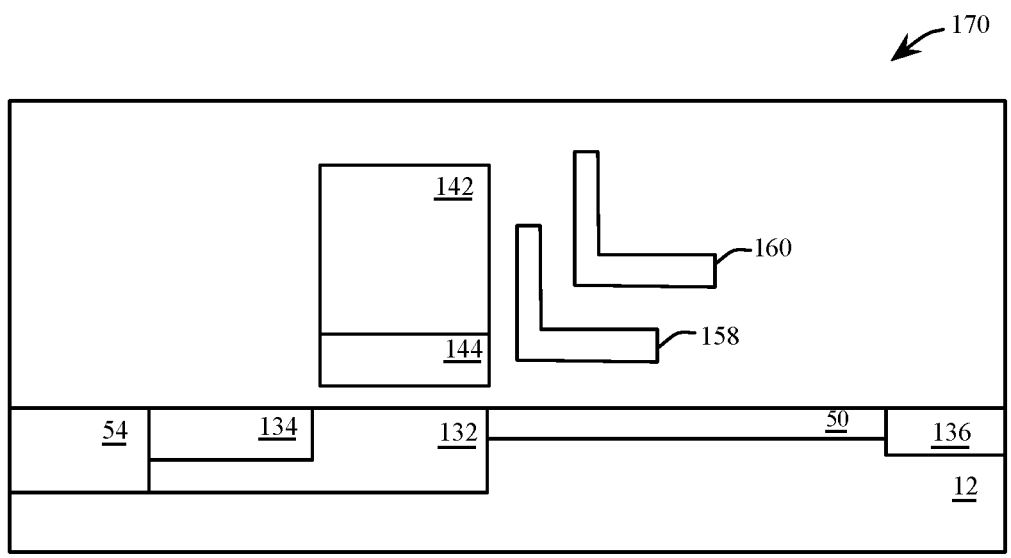
FIG. 14 is a cross-sectional view of an alternate embodiment of FIG. 13 formed concurrently, in accordance with an example embodiment of the present disclosure.

FIG. 14 shows an example embodiment 170 of an LDMOS transistor, formed with a similar process flow to the example embodiment 150 of FIG. 13 but with only a single N-implant 50. The example embodiment 170 is optimized for high voltage breakdown, whereas the example embodiment 150 is optimized for a low voltage application with reduced breakdown voltage ("BVDSS") and drain to source on-resistance ("RDSOn"). In one example, both embodiments 150 and 170 are formed within the same silicon die by separating the drain implants (formed by the N– implants) using the various liners to precisely align the implants. Thus, multiple types of transistors and other semiconductor devices are easily integrated into a single process flow and common semiconductor substrate.

Figure 15:
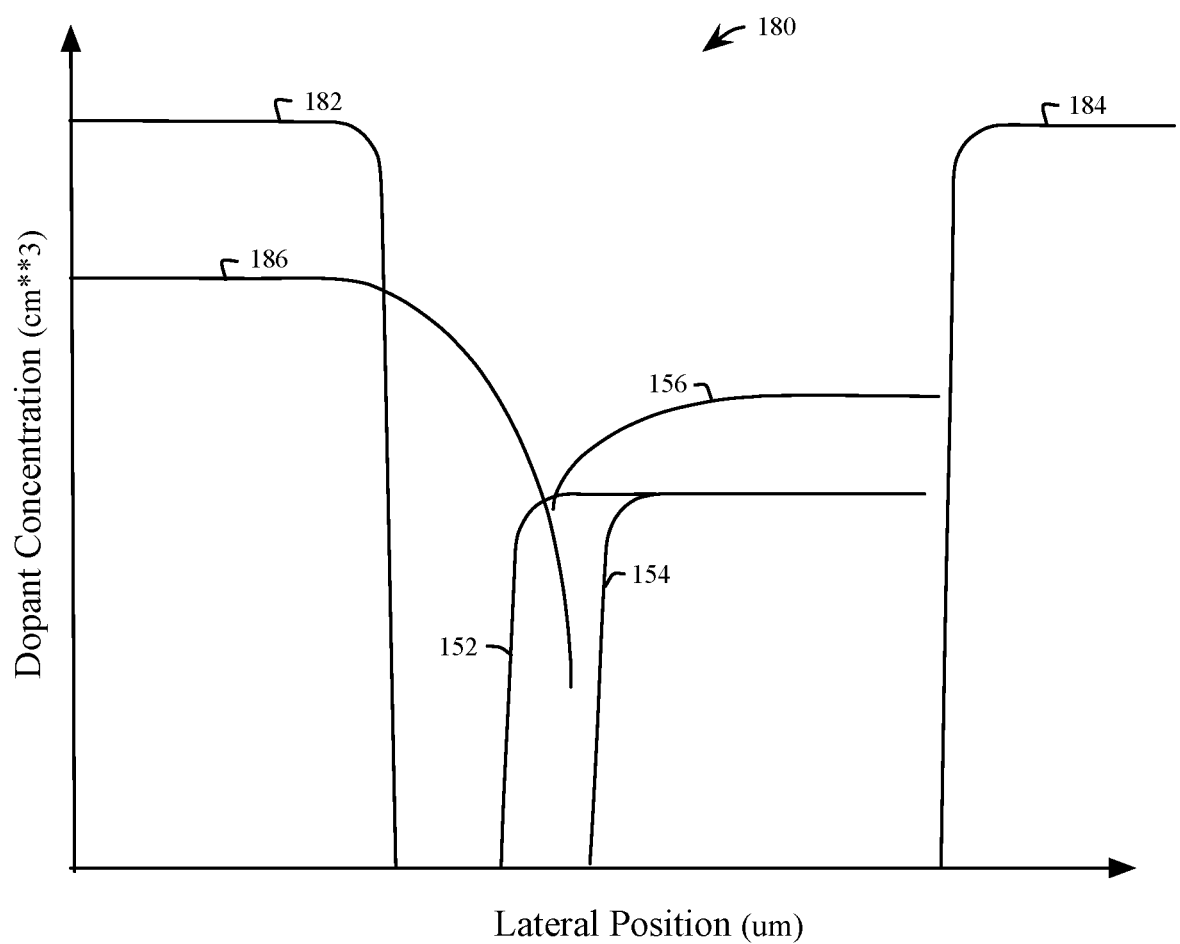
FIG. 15 is a graphical view of a doping profile of the LDMOS transistor of FIG. 14, in accordance with an example embodiment of the present disclosure.

FIG. 15 shows an example embodiment 180 of the doping profiles of an LDMOS transistor, taken laterally across the surface of the silicon, such as the example embodiment 150 of FIG. 13. The N– implant 50 and N– implant 116 have doping concentrations 152 and 154 respectively (e.g., doping concentrations in a range of about 8e16 cm–3 to about 4e17 cm–3, although the concentrations may be lower or higher). The doping concentrations 152 and 154 combine to form a net doping concentration 156 that is higher than the doping concentrations 152, 154. The N+ source region 52 and N+ drain region 118 have doping concentrations 182 and 184 respectively. The P-Well 120 has a doping concentration 186. The laterally graded drain formed by N– implants 50 and 116 results in a wider drain depletion near the gate with an equivalent RDSOn compared to an abrupt junction formed with a single higher dose N– implant.

Figure 16:
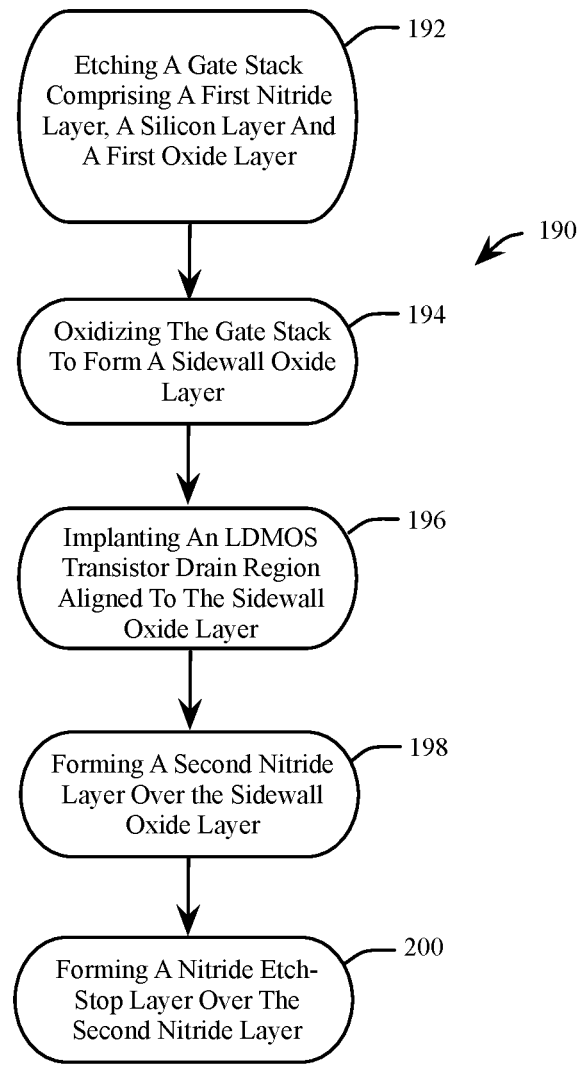
FIG. 16 is a flowchart representation of a method for manufacturing an LDMOS transistor with implant alignment spacers, in accordance with an example embodiment of the present disclosure.

FIG. 16 shows an example embodiment 190 of a method for manufacturing an LDMOS transistor with alignment spacers. With reference to FIG. 16 and the manufacturing steps shown in FIG. 1 through FIG. 14, at 192, a gate stack 32 comprising a first nitride layer 36, a silicon layer 34 and a first oxide layer 14 is formed using a series of material deposition processes, followed by a photoresist and etching process. At 194, the gate stack 32 is oxidized to form a sidewall oxide layer 44. At 196, an LDMOS transistor drain region 50 aligned to the sidewall oxide layer 44 is implanted. At 198, a second nitride layer (e.g., liner) 62 is formed over the sidewall oxide layer 44. At 200, a nitride etch-stop layer (e.g., a TEOS liner) 72 is formed over the second nitride layer 62.

Figure 17:
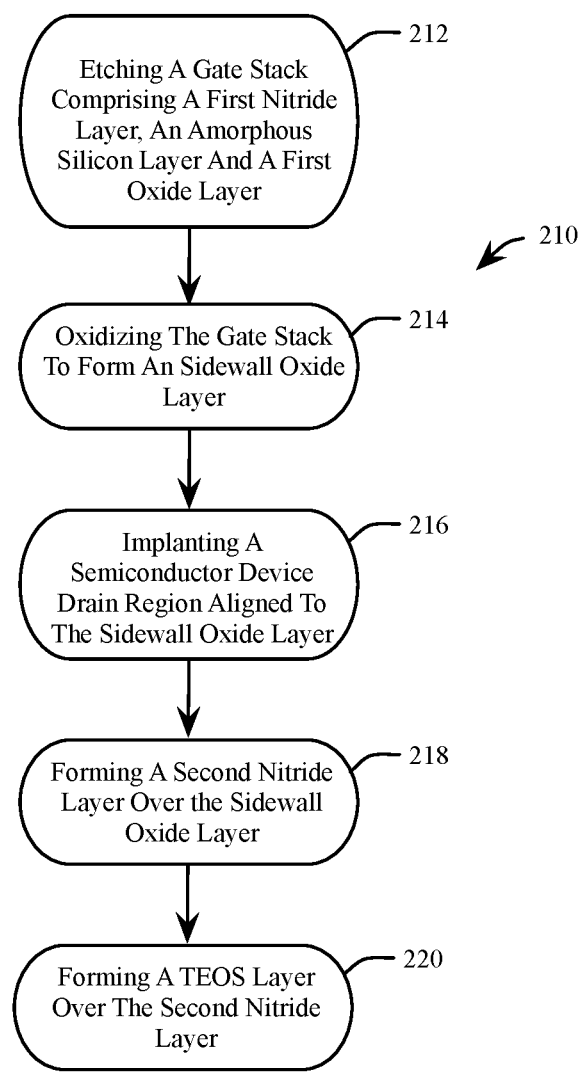
FIG. 17 is a flowchart representation of a method for manufacturing a semiconductor device with implant alignment spacers, in accordance with an example embodiment of the present disclosure.

FIG. 17 shows an example embodiment 210 of a method for manufacturing an LDMOS transistor with alignment spacers. With reference to FIG. 17 and the manufacturing steps shown in FIG. 1 through FIG. 14, at 212 a gate stack 32 comprising a first nitride layer 36, an amorphous silicon layer 34 and a first oxide layer 14 is formed using a series of material deposition processes, followed by a photoresist and etching process. At 214, the gate stack 32 is oxidized to form a sidewall oxide layer 44. At 216, a semiconductor device drain region 50 aligned to the sidewall oxide layer 44 is implanted. At 218, a second nitride layer (e.g., liner) 62 is formed over the sidewall oxide layer 44. At 220, a TEOS layer 72 is formed over the second nitride layer 62.

As will be appreciated, embodiments as disclosed include at least the following. In one embodiment, a method for manufacturing a Laterally Diffused Metal Oxide Semiconductor (LDMOS) transistor with implant alignment spacers comprises performing an etching process to produce a gate stack comprising a first nitride layer on a silicon layer. The gate stack is separated (e.g., electrically isolated) from a substrate by a first oxide layer. The gate stack is oxidized to form a polysilicon layer from the silicon layer, and to form a second oxide layer on a sidewall of the polysilicon layer. A drain region of the LDMOS transistor is implanted with a first implant aligned to a first edge formed by the second oxide layer. A second nitride layer is formed conformingly covering the second oxide layer. A nitride etch-stop layer is formed conformingly covering the second nitride layer.

Alternative embodiments of the method for manufacturing a Laterally Diffused Metal Oxide Semiconductor (LDMOS) transistor with implant alignment spacers include one of the following features, or any combination thereof. A source region of the LDMOS transistor is implanted with the first implant. A second implant of the drain region is aligned to a second edge formed by the second nitride layer. A second implant of the drain region is aligned to a second edge formed by the nitride etch-stop layer. A second implant of the drain region is aligned to a second edge formed by a nitride spacer formed over the nitride etch stop layer. A second implant is aligned to a second edge formed by one of the second nitride layer, the nitride etch-stop layer and a nitride spacer formed over the nitride etch stop layer. A third implant is aligned to a third edge formed by one of the second nitride layer, the nitride etch-stop layer and a nitride spacer formed over the nitride etch-stop layer. The second implant is implanted in a subset of a plurality of LDMOS transistors formed on the substrate. A second photoresist layer is formed over the nitride etch stop layer comprising an edge centered over the gate stack to block an implant to a source region of the LDMOS transistor. The first nitride layer, the second nitride layer and the nitride etch-stop layer are removed, and a first cobalt silicide layer is formed over the polysilicon layer to form a gate electrode thereon, wherein the cobalt silicide layer consumes less than all of the polysilicon layer, and a first thickness of the first oxide layer added to a second thickness of the second oxide layer exceeds a minimum thickness required to block a formation of a second cobalt silicide layer over the first implant.

In another embodiment, an apparatus comprises a gate stack comprising a cobalt silicide layer over a polysilicon layer. The polysilicon layer is separated from (e.g., electrically isolated from) a substrate by a first oxide layer. A second oxide layer is on a sidewall of the polysilicon layer. A drain region of a Laterally Diffused Metal Oxide Semiconductor (LDMOS) transistor is implanted with a first implant aligned to a first edge formed by the second oxide layer, wherein a first thickness of the first oxide layer added to a second thickness of the second oxide layer exceeds a minimum thickness required to block a formation of a second cobalt silicide layer over the first implant.

Alternative embodiments of the apparatus include one of the following features, or any combination thereof. A second implant of the drain region is aligned to a second edge offset from the first edge. The second implant is implanted in a subset of a plurality of LDMOS transistor formed on the substrate. A one or more field plates are formed between the gate stack and the drain region.

In another embodiment, a method for manufacturing a semiconductor device with implant alignment spacers comprises etching a gate stack comprising a first nitride layer on an amorphous silicon layer. The gate stack is separated from a substrate by a first oxide layer. The gate stack is oxidized to form a polysilicon layer from the amorphous silicon layer, and to form a second oxide layer on a sidewall of the polysilicon layer. A drain region of the semiconductor device is implanted with a first implant aligned to a first edge formed by the second oxide layer. A second nitride layer is formed conformingly covering the second oxide layer. A Tetraethyl Orthosilicate (TEOS) layer is formed conformingly covering the second nitride layer.

Alternative embodiments of the method for manufacturing a semiconductor device with implant alignment spacers include one of the following features, or any combination thereof. A nitride spacer is formed over the TEOS layer. A second implant is aligned to a second edge formed by one of the second nitride layer, the TEOS layer and the nitride spacer. The semiconductor device comprises a plurality of LDMOS transistors formed on the substrate, and the second implant is implanted in a subset of a plurality of LDMOS transistors. The first nitride layer, the second nitride layer and the TEOS layer are removed, and a first cobalt silicide layer is formed over the polysilicon layer to form a gate electrode thereon, wherein the cobalt silicide layer consumes less than all of the polysilicon layer, and a first thickness of the first oxide layer added to a second thickness of the second oxide layer exceeds a minimum thickness required to block a formation of a second cobalt silicide layer over the first implant. A one or more field plate are formed between the gate stack and the drain region.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a Laterally Diffused Metal Oxide Semiconductor (LDMOS) transistor with implant alignment spacers comprising:
   performing an etching process to produce a gate stack comprising a first nitride layer on a silicon layer, the gate stack separated from a substrate by a first oxide layer;
   oxidizing the gate stack to form a polysilicon layer from the silicon layer, and to form a second oxide layer on a sidewall of the polysilicon layer;
   implanting a drain region of the LDMOS transistor with a first implant aligned to a first edge formed by the second oxide layer;

forming a second nitride layer conformingly covering the second oxide layer; and forming a nitride etch-stop layer conformingly covering the second nitride layer.

2. The method of claim 1 further comprising implanting a source region of the LDMOS transistor with the first implant.

3. The method of claim 1 further comprising aligning a second implant of the drain region to a second edge formed by the second nitride layer.

4. The method of claim 1 further comprising aligning a second implant of the drain region to a second edge formed by the nitride etch-stop layer.

5. The method of claim 1 further comprising aligning a second implant of the drain region to a second edge formed by a nitride spacer formed over the nitride etch stop layer.

6. The method of claim 1 further comprising aligning a second implant to a second edge formed by one of the second nitride layer, the nitride etch-stop layer and a nitride spacer formed over the nitride etch stop layer.

7. The method of claim 6 further comprising aligning a third implant to a third edge formed by one of the second nitride layer, the nitride etch-stop layer and a nitride spacer formed over the nitride etch-stop layer.

8. The method of claim 6 wherein the second implant is implanted in a subset of a plurality of LDMOS transistors formed on the substrate.

9. The method of claim 1 further comprising forming a second photoresist layer over the nitride etch stop layer comprising an edge centered over the gate stack to block an implant to a source region of the LDMOS transistor.

10. The method of claim 1 further comprising removing the first nitride layer, the second nitride layer and the nitride etch-stop layer, and forming a first cobalt silicide layer over the polysilicon layer to form a gate electrode thereon, wherein the cobalt silicide layer consumes less than all of the polysilicon layer, and a first thickness of the first oxide layer added to a second thickness of the second oxide layer exceeds a minimum thickness required to block a formation of a second cobalt silicide layer over the first implant.

11. A method for manufacturing a semiconductor device with implant alignment spacers comprising:

etching a gate stack comprising a first nitride layer, the first nitride layer on an amorphous silicon layer, the gate stack separated from a substrate by a first oxide layer;

oxidizing the gate stack to form a polysilicon layer from the amorphous silicon layer, and to form a second oxide layer on a sidewall of the polysilicon layer;

implanting a drain region of the semiconductor device with a first implant aligned to a first edge formed by the second oxide layer;

forming a second nitride layer conformingly covering the second oxide layer; and forming a Tetraethyl Orthosilicate (TEOS) layer conformingly covering the second nitride layer.

12. The method of claim 11 further comprising forming a nitride spacer over the TEOS layer.

13. The method of claim 12 further comprising aligning a second implant to a second edge formed by one of the second nitride layer, the TEOS layer and the nitride spacer.

14. The method of claim 13 wherein the semiconductor device comprises a plurality of LDMOS transistors formed on the substrate, and the second implant is implanted in a subset of a plurality of LDMOS transistors.

15. The method of claim 11 further comprising removing the first nitride layer, the second nitride layer and the TEOS layer, and forming a first cobalt silicide layer over the polysilicon layer to form a gate electrode thereon, wherein the cobalt silicide layer consumes less than all of the polysilicon layer, and a first thickness of the first oxide layer added to a second thickness of the second oxide layer exceeds a minimum thickness required to block a formation of a second cobalt silicide layer over the first implant.

16. The method of claim 11 further comprising forming a one or more field plates between the gate stack and the drain region.

* * * * *